United States Patent

Hantusch et al.

[15] 3,675,089

[45] July 4, 1972

[54] HEAT DISPENSER FROM A SEMICONDUCTOR WAFER BY A MULTIPLICITY OF UNALIGNED MINUSCULE HEAT CONDUCTIVE RAISED DOTS

[72] Inventors: Gerald H. Hantusch; David A. Vincent; Eric H. Van Tongerloo, all of Ottawa, Ontario, Canada

[73] Assignee: Microsystems International Limited, Ottawa, Ontario, Canada

[22] Filed: Sept. 11, 1970

[21] Appl. No.: 72,559

[30] Foreign Application Priority Data

Aug. 14, 1970 Canada ..................................090,833

[52] U.S. Cl. ....................317/234 R, 317/234 A, 317/234 H, 317/234 J, 317/234 M, 317/234 N, 29/589, 29/590

[51] Int. Cl. ..........................................H01l 3/00, H01l 5/00

[58] Field of Search .......................317/234, 235, 1, 3, 3.1, 4, 317/4.1, 5, 5.3, 5.2, 5.4; 29/580, 583, 589, 590, 591

[56] References Cited

UNITED STATES PATENTS

| | | | |
|---|---|---|---|
| 2,784,300 | 3/1957 | Zuk | 317/235 |
| 3,239,719 | 3/1966 | Shower | 317/234 |
| 3,254,389 | 6/1966 | Andres et al. | 317/234 |
| 3,390,308 | 6/1968 | Marley | 317/234 |
| 3,457,476 | 7/1969 | Dill | 317/234 |
| 3,544,704 | 12/1970 | Glenn | 317/234 |

*Primary Examiner*—John W. Huckert
*Assistant Examiner*—Andrew J. James
*Attorney*—Edward E. Pascal

[57] ABSTRACT

A heat sink for a semiconductor wafer comprising a multiplicity of individual miniscule raised dots of heat conducting material adherent to the surface of an electrically insulative, but heat conductive substrate. The wafer is mounted on the tops of the dots. The dots provide heat conductive paths from the wafer to the substrate, do not short circuit between exposed elements of the wafer, while taking up the strain of differential expansion and contraction between the wafer and the substrate during heating and cooling.

8 Claims, 6 Drawing Figures

INVENTORS
GERALD H. HANTUSCH
DAVID A. VINCENT
ERIC H. VAN TONGERLOO
AGENT E E Reed

INVENTORS
GERALD H. HANTUSCH
DAVID A. VINCENT
ERIC H. VAN TONGERLOO
AGENT

HEAT DISPENSER FROM A SEMICONDUCTOR WAFER BY A MULTIPLICITY OF UNALIGNED MINUSCULE HEAT CONDUCTIVE RAISED DOTS

This invention is in the field of electronic semiconductor devices, and relates to a structure and technique for bonding such devices to substrates in a manner which will ensure good thermal contact.

Where a semiconductor device such as an integrated circuit wafer must be mounted on a substrate, it is often difficult to obtain good heat dissipation from the wafer to the substrate. Due to the difference in thermal coefficients between the integrated circuit wafer and the substrate, physical contact between the two is often limited to such places as the contact leads themselves. The general problem underlying the physical contact structure is that the material of one expands faster than that of the other during heating, resulting in cracking of the heat conducting bond. In the case of beam lead devices, contact may be limited to the beams themselves; sometimes the body of the wafer is mounted on the substrate through an intermediary material having less than optimum heat conductivity, the material being caused to flow, providing a compromise between the desired heat conductivity to the substrate and reliability of contact.

This general problem is magnified as integrated circuits are made larger, for instance by medium and large scale integration. It is important to provide a good heat sinking facility for the integrated circuit wafers, minimizing the tendency for the bonds to crack at the junctures of the wafers and heat sinks during heating, as the integrated circuits pass current. In addition, as air isolated, and hybrid integrated and thin film circuits come into more widespread use, a standard technique of mounting the integrated circuits is desirable for economic reasons as well as the technical reasons described above.

Another approach to solving the difference in thermal expansion problem involves the use of a mosaic assembly of individual metallic bodies or elements bound together as in a thin section of stranded cable, each element being capable of being displaced relative to the others. The section is placed between a semiconductor and its heat sink substrate, and can follow any thermal expansion differential between the two, compensating therefor, while allowing heat conduction therebetween. Such a device is described in U.S. Pat. No. 3,128,419 to E. Waldkotter et al., issued Apr. 7, 1964.

Unfortunately, devices of this nature suffer from a problem as applied to integrated circuit wafers in that by this very mechanical structure, each individual element is short circuited electrically to the next. Therefore, should one element touch a terminal of the integrated circuit, that terminal will almost certainly be short circuited to another through the bound mosaic of elements.

In order to avoid the short circuiting problem just described, another solution to the mounting problem was proposed which provides posts or pillars of conductive material, air insulated from each other, on a substrate in mirror image to the terminals on a transistor or integrated circuit wafer which is to be mounted thereon. Such a design is described in U.S. Pat. No. 3,373,481 to S. J. Lins et al., issued Mar. 19, 1968, and another form is described in U.S. Pat. No. 3,403,438 to H. S. Best et al., issued Oct. 1, 1968. The pillars are intended to act as electrical conductors as well as heat conductors. External connections to the wafer may be made via conductive strips adherent to the surface of the substrate, either to the pillars, or to other means of connection to the wafer.

However, this solution suffers from the requirement for precise alignment of the wafer with respect to the substrate, in order that the pillars line up exactly with predesignated positions on the substrate. This requirement introduces an opportunity for error in alignment, reducing the yield of finished devices.

We have invented a mounting device for a semiconductor which provides the advantages of differential expansion compensation provided by the first described bound mosaic of elements which compensates for the difference in thermal coefficients of the wafer and substrate, with virtual elimination of the short circuiting problem between terminals of the wafer. This has been achieved while obviating the requirement for precise alignment between the parts.

The invention comprises a mounting substrate of electrically insulating but heat conductive material, and a multiplicity of minuscule heat conductive raised dots disposed over a predetermined area of the substrate, the dots being spaced and electrically insulated from each other. A wafer is mounted on the top surface of the dots but is not aligned with them. The dots are of such small diameter in comparison to the average terminal size on an integrated circuit wafer that the probability of short circuiting between terminals, or exposed elements of the wafer by the end of a single dot is negligible.

Yet because of the large multiplicity of dots, heat is transferred readily from all parts of the wafer to the substrate, helping to keep the wafer cool and therefore minimizing thermal expansion differential, and enabling differential movement between the parts in a pseudo-plastic mode.

It will be understood that the term "dot" is used in the application to describe a stump or pillar-shaped structure; yet because of its small size, it may appear to the naked eye as a dot.

A better understanding of the invention may be obtained by reference to the following drawings, in which.

Figure 1:
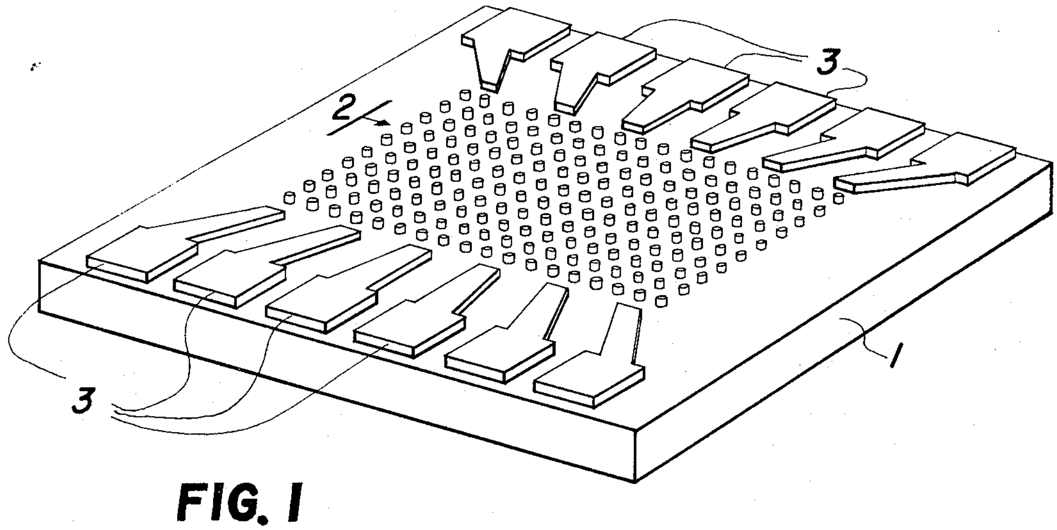
FIG. 1 is a perspective view of a mounting device for a semiconductor wafer according to this invention.

Turning to FIG. 1, a substrate 1 on which a wafer is to be mounted is shown, comprising electrically insulating but heat conductive material. Disposed on its surface, and adherent thereto, are a multiplicity of minuscule heat conductive raised dots 2. One or more integrated circuit wafers may be adhered to the top surface of said dots 2, in order to provide a structural base as well as a heat sink for the wafers.

Materials which usefully may be employed for the substrate are typically alumina, beryllia, or an aluminum oxide ceramic trademarked Alsimag 748 by American Lava Corporation. However, other electrical insulating substrate materials may be used provided the dots 2 may be adhered thereto and provided the materials form a good heat sink. The substrate may also be the substrate of a thin film circuit at the same time as it forms a heat sink for an integrated circuit wafer.

FIG. 1 shows dots 2 disposed in a regular array over an area considerably smaller than the substrate 1. The placement of dots 2 may alternatively be random, and they may cover the entire surface of the substrate 1. However it is useful to dispose the array of dots over a more restricted area than the total surface, and to provide terminal land areas 3 to which an integrated circuit wafer may be wired. The land areas 3 may be of the type to which the wafer may be wired using conventional wire bonding techniques, or they may be of the type to which beam leads extending from the wafer may be connected (shown in FIG. 6 and discussed later).

The size of the dots used depends on the expected size of the smallest exposed elements on the integrated circuit wafer which is to be mounted on the top surface of the dots. For example, let us assume that the smallest exposed elements on an integrated circuit consist of metallized paths 5 leading from one terminal of an active element to another.

Figure 2:
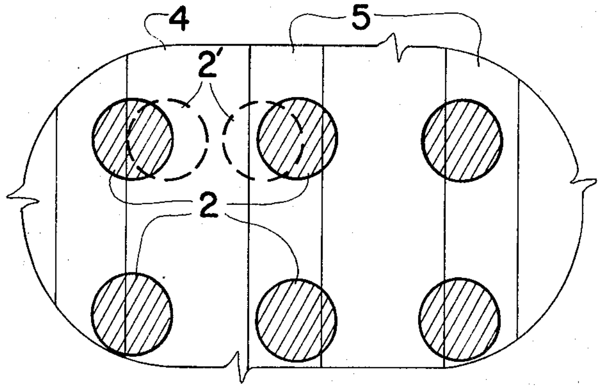
FIG. 2 is an enlarged underside view of a portion of a wafer mounted on its heatsink, showing the dots in section.

FIG. 2 shows an enlarged underside view of a portion of a wafer 4 which is to be mounted on a heat sink, with conductive paths 5 adherently traversing thereover. The place of random contact of a typical dot 2 is shown in section. The dot must be so small that it must not short circuit between conductive paths 5. It is preferred that the diameter of dot 2 not be greater than one-half the smallest distance between conductive paths 5 in this example; in general, the diameter should not be greater than one-half the distance between any two non-isolated active elements on the integrated circuit, or one-half the distance between two isolated circuits of an integrated circuit wafer, whichever is smallest.

FIG. 2 also shows the location of the dot 2' in dashed outline offset from dot 2 where it may touch during random placement of the wafer. It may be seen that as the location of the dot is moved, the dot is so small as to avoid short circuits between adjacent exposed elements.

The example shown is one in which the chip is mounted with its face against the dots, and towards the substrate, which is the preferred arrangement. The active elements on the wafer now are arranged to have the shortest thermal paths from their heat producing centers to the heat sink, through the dots 2. With the bottom of the wafer against the dots, heat would have to traverse the thickness of the wafer before dissipating, resulting in more general heating of the wafer. However, the latter arrangement may still usefully be utilized, and if wire bonds are to be used for external connection to the wafer, the wafer must be mounted with its active face away from the substrate in order to facilitate bonding.

Figure 3:
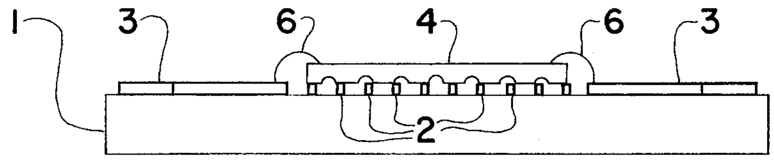
FIG. 3 is a side elevation of the device of FIG. 1, including a semiconductor wafer mounted in combination therewith.

FIG. 3 is a side elevation of the device in FIG. 1, showing a semiconductor wafer wire bonded in combination therewith. A multiplicity of raised dots 2 is adherently disposed on the surface of substrate 1. Terminal land areas 3 are spaced from the dots an appropriate distance in order to receive wires used to connect the wafer.

A semiconductor wafer 4, is adherently fixed to the top surface of the dots 2. Wire leads 6 may be used to interconnect the wafer 4 with land areas 3 in a well known manner. However, as mentioned earlier, beam leads may be utilized, and if they are, the beams will have to be aligned with the land areas before bonding. There will be a height differential between land areas and dots if beam leads are to be used, in order to compensate for the difference in thickness of the beams and the thickness of the wafer, both when the wafer is to be mounted with the beams facing toward the substrate, and away from the substrate.

Figure 4:
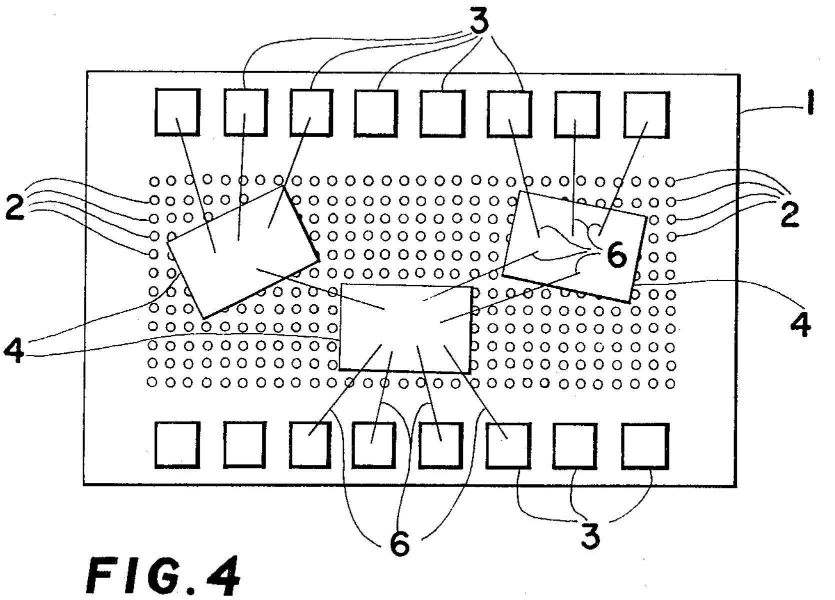
FIG. 4 is a plan view of the invention, including a number of semiconductor wafers mounted in combination therewith.

FIG. 4 is a plan view of the mounting device according to the invention, including a number of semiconductor wafers mounted in combination therewith. Substrate 1 is shown having a multiplicity of raised dots 2 adherently disposed on its surface, and terminal land areas 3 deposited on the substrate for external connection thereto.

This figure also shows the implementation of one of the very useful attributes of the invention; non-aligned mounting of more than one wafer on the top surface of the dots 2. Three wafers 4 are shown mounted with no precise alignment to the dots 2. It may be seen that a single substrate may be used as a common heat sink for a number of wafers, with little regard to short circuiting of exposed elements on the wafers 4 through the heat sink, substrate 1.

FIG. 4 also shows wire bonding leads 6 interconnecting wafers 4 as well as wafers 4 to land areas 3. The wafers may be arranged for the most efficient interconnection pattern, minimum overall area, etc.

While only terminal land areas 3 have been shown for external connection to wafers 4, of course the section of substrate 1 shown may be part of a thin film circuit which contains other passive and/or active components. Therefore dots 2 may be deposited directly on the thin film substrate, and a wafer mounted on the dots. Connection of the wafer may therefore be made directly to the other components on the thin film substrate.

To produce this invention the dots are screen printed on the surface of the substrate, in a well known manner. A gold paste such as palladium-gold, or Cermet Platinum Gold C–6000 trademark available from Alloys Unlimited Ltd., Melville, Long Island, New York, may be used through the screen. The dots should be screened to the diameter described earlier, for example about 5 mils in width and 2 mils in height.

After the gold paste has been screen printed, dots of a well known tin-gold eutectic solder paste should be screened over the dots already printed, in registration therewith. The width of the latter dots should be the same as those underlying, and should build up the original dots an additional 2 mils, in this example. Thus the result is an array of dots each 5 mils wide and 4 mils high built in two layers, a bottom layer of gold alloy such as palladium or platinum gold, and top layer of gold solder such as tin-gold eutectic solder. The dots should preferably be spaced about one dot width apart, but other spacing may be used within the scope of the invention.

The dried substrate is then heated in order to force the eutectic solder to ball up. With the solder just described, a temperature of 300° Centigrade may be used. At this point the wafer is placed over the dot array and the entire assembly is cooled as rapidly as possible, such as by pouring cold nitrogen or air over it. The purpose of rapidly cooling the assembly is to minimize or prevent any gold present in the wafer from being leached into the solder. After cooling it will be seen that the eutectic solder has caused adhesion of the wafer to the gold dots, and therefore is held firmly above to the substrate.

Terminal land areas on substrate may be screen printed at the same time as the bottom layer (the gold alloy) of the dots, and thus may be made of the same material. Gold eutectic solder may be screen printed to particular locations on the land areas, in order to allow adherence to beam terminals of a beam lead wafer.

Figure 5:
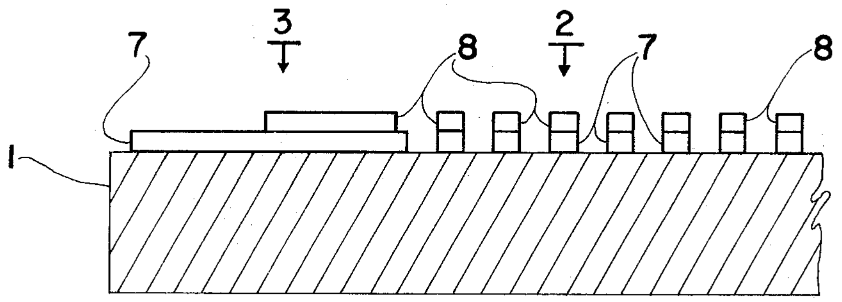
FIG. 5 is a front sectional view of the invention.

FIG. 5 shows a section of a substrate 1 according to this invention in preparation for mounting a wafer which utilizes beam leads for external connection. Substrate 1 has a multiplicity of dots and conductive paths screen printed thereon. The raised dots and terminal land areas 3 are comprised of a bottom layer 7 of gold alloy. While for clarity of explanation the dimensions of all parts of the figure are shown exaggerated, it may be seen that in this example the bottom layers 7 of the terminal land areas 3 are of different height than those of dots 2. This may be accomplished by screen printing the elements to be built up successively to the desired heights.

An upper layer 8 of tin-gold eutectic solder paste is screen printed in registration with the bottom layer 7 of the dots, and over selected portions of the terminal land areas 3 where the beams of beam leaded wafers are to be bonded. Alternatively, the beams may be connected directly to the gold layer by conventional ultrasonic welding or other techniques. In that case, there should be no eutectic solder printed over the terminal land areas, but the bottom layer should be built up to an appropriate height whereby little bonding strain will develop in the beams after bonding.

Figure 6:
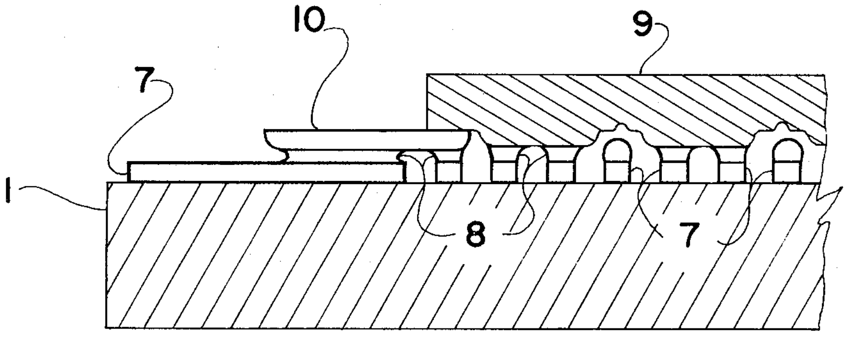
FIG. 6 is a front sectional view of the invention, in combination with a wafer having beam lead terminals.

FIG. 6 shows the device described in FIG. 5, also in section, with an integrated circuit wafer utilizing beam leads in combination therewith. An integrated circuit 9 having beam leads 10 extending therefrom has been placed with its active face down toward substrate 1. Beam leads 10 are aligned with terminal land areas 3. The integrated circuit usually will have an uneven face adjacent the substrate 1, shown in profile, due to various stages of processing which it will have undergone. During the heating stage described earlier, the upper layer 8 of the dots will have undergone melting, and balling, and when the wafer is laid thereover, adherence will have taken place to the surface of the integrated circuit 9 as well as to beam leads 10.

It may be seen that a multiplicity of heat conductive paths through the raised dots is produced, each electrically insulated from the other, leading from the active surface of the integrated circuit wafer 9 to the heat sink substrate 1. Electrical connection to an external circuit is effected via beam leads 10 connected electrically to terminal land areas 7. Due to a pseudo plastic movement of the array of dots, differential expansion and contraction of the integrated circuit wafer and the substrate is compensated for, adherence is maintained, and cracking of the heat conductive bond between the wafer and the substrate is avoided.

Variations of the embodiment described may now become obvious to those skilled in the art understanding this invention. For instance, one embodiment may be comprised of a ceramic substrate coated with a suitable metal such as gold, which has been cut into a pattern of square, triangular, or other islands constituting the earlier defined dots. A saw or other type of channel cutting tool may be used to provide the spaces between the islands or dots. Care must be taken, of course, to eliminate all metal between the dots, to the electrically insulative substrate in order that the dots not be short-circuited to each other.

The substrate chosen may be of the same types of material described with respect to the first embodiment. The gold or other suitable metal covering the substrate may be deposited by any well-known means. A suitable material is a gold paste of palladium-gold, or Cermet Platinum Gold C–6000 trademark mentioned earlier.

Another embodiment is comprised of a ceramic or heat-conducting but electrically insulative substrate having a metal layer which has been etched into dots. In manufacture, a well-known photoresist layer is placed over the metal layer, and exposed to light through a mask. After washing away the portions of the photoresist where etching is to take place, the coated substrate is exposed to a well-known etching solution which etches the metal surrounding the dots to the substrate. This technique enables considerably smaller dots to be obtained.

Both last-described embodiments of the invention may be used without a top layer of solder. The well-known technique of eutectic bonding may be usefully employed to bond a wafer directly to the top surfaces of the dots.

In the embodiments described above, the gold or other metallic coating on the substrate need not cover the entire surface. There may be great advantages to limiting the area of the coating, and thus the dots, to small predetermined locations to facilitate wiring between the wafer and thin or thick film conductive paths on the substrate.

Other variations or embodiments may become evident to those skilled in the art after reading this specification. Those within the ambit of the claims are all within the spirit and scope of the invention.

What is claimed is:

1. A mounting device for a semiconductor wafer having an arrangement of conductive elements on its surface, comprising:
   a. a mounting substrate of electrically insulating but heat conductive material,
   b. a multiplicity of minuscule heat conductive raised dots regularly arranged on, and adherent to, a predetermined surface area of the substrate, the diameter of each of said dots being smaller than the smallest distance between adjacent elements on the surface of said wafer,
   c. said dots being spaced and electrically insulated from each other.

2. A device as defined in claim 1, said dots each being comprised of a bottom layer of material selected from the group consisting of platinum-gold and palladium-gold, and a top layer comprised of a gold eutectic solder; the substrate being comprised of a material chosen from the group consisting of alumina and beryllia.

3. A device as defined in claim 2, said dots each being comprised of a bottom layer of Cermet Platinum Gold (trademark) material, and a top layer of tin-gold eutectic solder; the substrate being comprised of beryllia.

4. A device as defined in claim 2, said dots each being approximately 5 mils in diameter and 4 mils in height.

5. A device as defined in claim 1 further comprising electrically conductive land areas adhered to the surface of the substrate, located so as to facilitate electrical connection with terminals on said wafer.

6. A device as defined in claim 5, beam terminals extending from the surface of said wafer, said land areas being located so as to facilitate alignment and electrical connection with the beam terminals.

7. A device as defined in claim 1 including a group of integrated circuit wafers randomly located with respect to the tops of said dots, bonded to the tops thereof.

8. A mounting device as defined in claim 1, said dots being comprised of a single layer of material chosen to be suitable for eutectic bonding to a surface of the wafer.

* * * * *

UNITED STATES PATENT OFFICE
CERTIFICATE OF CORRECTION

Patent No. 3,675,089 Dated July 4, 1972

Inventor(s) Gerald H. Hantusch, et. al.

It is certified that error appears in the above-identified patent and that said Letters Patent are hereby corrected as shown below:

On the cover sheet [54] and column 1, line 1, "DISPENSER" should read -- DISPERSION -- .

Signed and sealed this 1st day of May 1973.

(SEAL)
Attest:

EDWARD M.FLETCHER,JR.
Attesting Officer

ROBERT GOTTSCHALK
Commissioner of Patents